United States Patent [19]

Hughes et al.

[11] 4,325,073
[45] Apr. 13, 1982

[54] FIELD EFFECT DEVICES AND THEIR FABRICATION

[75] Inventors: Brian T. Hughes, Sandy; Reuben Redstone, Letchworth; John C. Vokes, Harpenden; David R. Wight, Hitchen, all of England

[73] Assignee: The Secretary of State for Defence in Her Britannic Majesty's Government of the United Kingdom of Great Britain and Northern Ireland, London, England

[21] Appl. No.: 44,274

[22] Filed: May 31, 1979

[30] Foreign Application Priority Data

May 31, 1978 [GB] United Kingdom ............... 25553/78

[51] Int. Cl.³ .................... H01L 29/80; H01L 21/208
[52] U.S. Cl. ......................... 357/22; 29/571; 29/580; 29/589; 29/590; 148/171; 148/172
[58] Field of Search ................. 29/571, 580, 589, 590; 148/171, 172; 357/23, 22

[56] References Cited

U.S. PATENT DOCUMENTS

| | | | |
|---|---|---|---|
| 3,621,565 | 11/1971 | Sandstrom et al. | 29/590 |
| 3,823,467 | 7/1974 | Shamash et al. | 29/590 |
| 3,914,137 | 10/1975 | Huffman et al. | 148/175 |
| 3,930,912 | 1/1976 | Wisbey | 29/580 |
| 3,972,770 | 8/1976 | Stein | 156/600 |
| 4,048,712 | 9/1977 | Buiatti | 29/579 |
| 4,049,488 | 9/1977 | Tijburg | 156/655 |
| 4,136,352 | 1/1979 | Moutou et al. | 357/22 |
| 4,193,836 | 3/1980 | Youmans et al. | 148/187 X |

FOREIGN PATENT DOCUMENTS

| | | |
|---|---|---|
| 1514943 | 9/1969 | Fed. Rep. of Germany . |
| 2045856 | 4/1971 | Fed. Rep. of Germany . |
| 2386903 | 11/1978 | France . |
| 1119064 | 7/1968 | United Kingdom . |
| 1275004 | 5/1972 | United Kingdom . |
| 1553923 | 10/1979 | United Kingdom . |

Primary Examiner—G. Ozaki
Attorney, Agent, or Firm—Pollock, VandeSande & Priddy

[57] ABSTRACT

A method of fabricating a field effect transistor comprising the steps of forming an active layer of semiconductor material (GaAs) over a surface of a first substrate of semiconductor material (GaAs), applying a second substrate of insulating material, e.g. glass, over the surface of the active layer, removing the first substrate so that the active layer is now supported on the insulating second substrate, and forming source, drain and gate electrodes over the free surface of the active layer. To facilitate removal of the GaAs first substrate by selective etching, a buffer layer of GaAlAs resistant to the GaAs etchant, may be formed between the active layer and the first substrate, which buffer layer is removed, following removal of first substrate, using a selective etchant to which the GaAs active layer is resistant. The technique is particularly applicable to high frequency FETs requiring a very thin active channel region interfaced to a substrate having good insulating properties.

20 Claims, 10 Drawing Figures

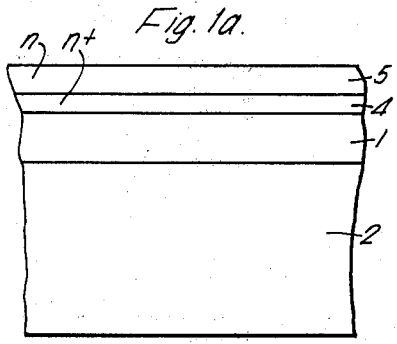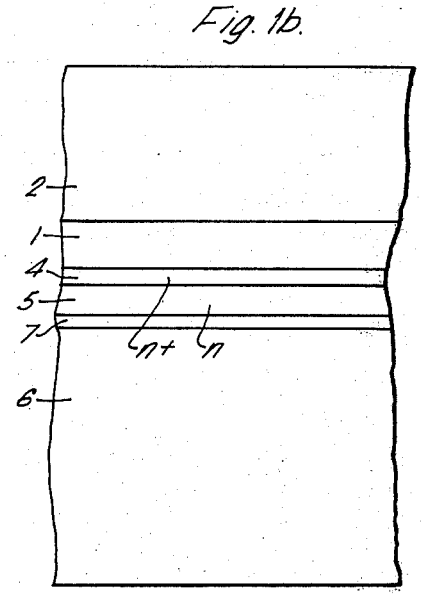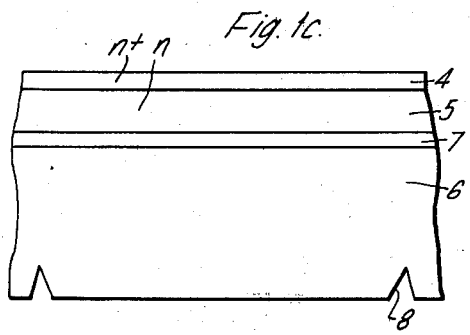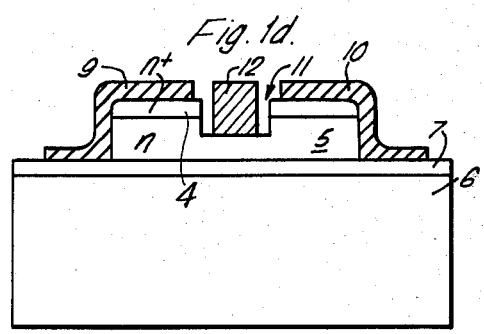

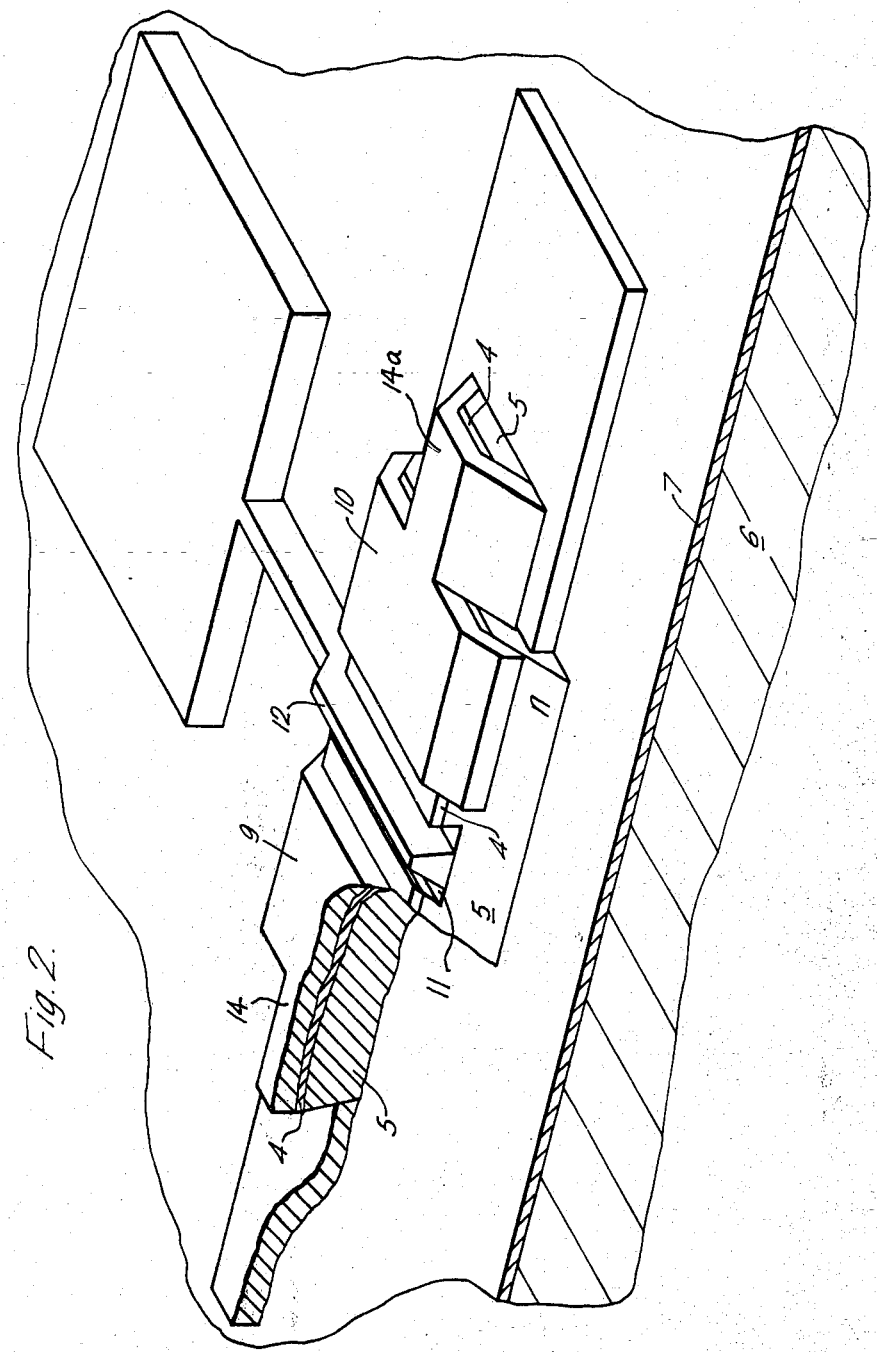

FIELD EFFECT DEVICES AND THEIR FABRICATION

This invention relates to methods of fabricating field-effect transistors (FETs) and to FET devices fabricated by such methods.

Conventional low-noise microwave FETs normally comprise a high resistivity or semi-insulating semiconductor substrate formed with a thin high-quality epitaxial active layer on which the source, gate and drain electrodes are formed.

Theoretical and experimental evidence suggests that the performance of conventional low-noise microwave FETs, and also to a certain extent power FETs, is limited because of a reduction in the mutual conductance ($g_m$) of the device as the gate bias is increased towards pinch-off. It is thought that the major reason for this reduction in mutual conductance is that charge carriers in the active channel region underlying the gate electrode are forced into the substrate at high gate biases, with a resultant 'softening' of the I-V characteristics. To enable high mutual conductance to be achieved near pinch-off, it is desirable to maintain the charge carriers within the active layer.

It has been proposed to adapt the technology developed for the fabrication of GaAs photocathodes to the fabrication of low-noise non-coplanar GaAs FETs to enable the active channel region underlying the gate electrode to be interfaced to a good insulator instead of to the usual high resistivity of semi-insulating GaAs substrate, and to enable the gate electrode be placed on the opposite side of the active layer to the source and drain electrodes (non-coplanar.) A method of fabricating such an FET is described in Annual Report No. (1976-1975) prepared by D. R. Decker and S. G. Bandy of Varian Associates, Palo Alto, Calif. under contract No. N00014-75-C-0303 with the U.S. Office of Naval Research, which publication is abstracted in U.S. Government Reports Announcements, Vol. 77, No. 5, field 9A under No. ADA032809.

The described method involves formation of ohmic source and drain electrodes on the surface of an epitaxial active layer formed on a semiconductor substrate; sealing this surface to a dielectric support substrate; removing the original semiconductor substrate using differential etching; and then forming a gate electrode on the surface of the active layer opposite to that on which the source and drain electrodes are formed.

According to the present invention, a method of fabricating a field effect transistor (FET) comprises the steps of forming an active layer of semiconductor material over a surface of a first substrate of semi-conductor material, applying a second substrate of insulating material to the surface of the structure comprising the first substrate and active layer so that the active layer lies between the two substrates, removing the first substrate, and forming source, drain and gate electrodes over the surface of the active layer opposite the second substrate.

The method in accordance with the invention can be used to make coplanar FETs (i.e., in which the source, drain and gate electrodes all lie on the same side of the active layer) of substantially conventional design except that the usual high resistivity or semi-insulating semi-conductor substrate is replaced by a substrate having good insulating properties. Thus, after the removal of the first substrate, design and fabrication procedures similar to those used for conventional FETs may be used to complete the device fabrication.

Preferably a high quality buffer layer of semiconductor material is formed on the surface of the first substrate prior to formation of the active layer, and is removed following removal of the first substrate. Preferably the first substrate is removed by etching using a selective etchant which attacks it faster than it attacks the buffer layer, and the buffer layer may then also be removed by etching using a selective etchant which attacks it at a faster rate than it attacks the first substrate.

Where the first substrate comprises GaAs, and the active layer is n-type GaAs, the buffer layer preferably comprises GaAlAs removed using HF as the etchant.

The buffer layer also provides a barrier against the migration of impurities from the conventionally low quality first substrate into the active layer.

Whatever method of removing the first substrate is used, whether or not a buffer layer is provided, a thin surface layer of the active layer at least in the region on which the gate electrode is to be formed, may be removed prior to formation of the gate electrode to remove any impurities or surface defects in the active layer due to its interface with other layers.

Preferably a thin layer of high conductivity semiconductor material of the same conductivity type as the active layer is formed immediately prior to the formation of the active layer on its surface, and following removal of the first substrate and any buffer layer present, the source and drain electrodes are then formed as ohmic contacts on this high conductivity layer. This improves the quality of the ohmic contacts. Part of this high conductivity layer between the source and drain contacts is removed, preferably after the source and drain electrodes are formed to enable the gate electrode to be applied as a Schottky barrier contact with the active layer.

Where there is a likelihood of degradation of the active layer due to the presence of, or the techniques used in applying, the second substrate to the structure comprising the first substrate and active layer, this problem can be alleviated by providing an air gap at the interface between the gate region of the active layer and the second substrate or its bonding medium. Any degradation of the active layer in the gate region, i.e., that region underlying the gate electrode and providing the channel of the FET, will critically affect the low noise operation of the device.

This air gap may conveniently be achieved by recessing the surface of the active layer on which the gate electrode is to be formed before applying the second substrate. Alternatively, prior to application of the second substrate, a non-conducting semi-conductor layer may be formed on the free surface of the active layer, and a region of this non-conducting layer then etched away to expose the channel region of the active layer immediately opposite that on which the gate electrode is to be formed.

The second substrate may be of any suitable insulating material. However, the material used and/or its bond with the structure comprising the first substrate and active layer should have good mechanical properties, provide a good thermal expansion match with the active layer and first substrate, and be capable of withstanding the temperatures and chemicals used in subsequent fabrication steps. Where the method is used to fabricate microwave FETs, the second substrate or at least the means by which it is applied to the first substrate and active layer structure, should also have good microwave properties. In addition, the process used to apply the second substrate to the structure comprising the first substrate and active layer must cause no substantial degradation of the active layer, particularly in the gate region.

The second substrate may be applied by means of a suitable adhesive, e.g., polyimide resin. A suitable polyimide adhesive is KERIMID (Registered Trade Mark) 601, a condensation type polyimide resin manufactured by Rhone-Poulenc, which combines good microwave properties with good chemical and thermal stability.

Alternatively, a coating of suitable insulating material such as $SiO_2$, $Si_3N_4$, alumina, a plastics, e.g., polyimide, resin, glass or polycrystalline GaAs may be applied to the appropriate surface of the structure comprising the first substrate and the active layer, and the second substrate then bonded to this insulating coating using a suitable adhesive. The requirements for this adhesive as regards its thermal expansion and chemical match to the structure, and its microwave properties are far less stringent, and so a wider range of adhesives may be used.

A further method of applying the second substrate is to form it in situ on the surface of the structure comprising the first substrate and active layer, or on the insulating coating where provided.

The second substrate may comprise glass applied to the structure comprising the first substrate and active layer by first applying a coating of $SiO_2$ and then fusion bonding the glass substrate to the $SiO_2$ coating. Any suitably low melting point glass, such as borosilicate glass, may be used instead of $SiO_2$.

The invention will now be described in more detail, by way of example only, with reference to the accompanying drawings, in which:

FIGS. 1(a) to 1(d) show schematic sectional views illustrating various stages in the fabrication of a FET by a method in accordance with the present invention;

FIG. 2 is a diagrammatic part-sectional perspective view of an FET fabricated by the method illustrated in FIG. 1;

Figure 3:
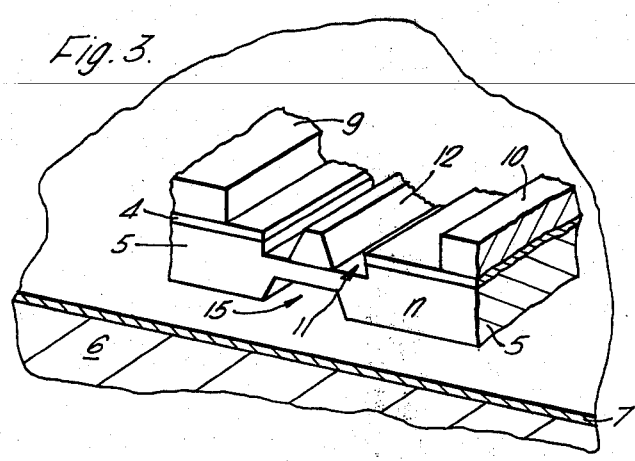
FIG. 3 is a schematic perspective part-sectional view of a modified form in accordance with the invention.

Referring to FIGS. 1(a) to 1(d) a low noise microwave FET is fabricated in accordance with the invention by forming a buffer layer 1 of GaAlAs having a thickness of the order of 2 to 5 μm, on a first substrate 2 of semi-insulating GaAs, typically about 200 μm thick, and then forming a thin (0.2 to 0.5 μm) layer 4 of high conductivity (n+) GaAs followed by an active layer 5 of n-type GaAs in the range 0.2 to 1 μm thick, on the surface of the buffer layer 1. Each of the layers is grown by liquid or vapour phase, or molecular beam epitaxy in accordance with known techniques.

The structure comprising the substrate 2, buffer layer 1, high conductivity layer 4 and active layer 5 is then bonded to a second, glass substrate 6, of the order of 2 mm thick. This is effected by coating the free surface of the active layer 5 with a layer 7 of $SiO_2$ applied by chemical vapour deposition to a thickness of the order of 0.2 μm, to which the second substrate 6 is heat bonded at a temperature of about 700° C. A suitable glass for the second substrate is Corning glass 7056.

To facilitate subsequent dicing of the substrate into individual device chips, the rear surface of the glass may at this stage be lapped down to a thickness of about 0.4 mm and polished. Slots 8 are then cut into the rear surface at device pitch and parallel to the cleavage planes. Alternatively these slots may be cut into the top surface of the glass substrate 6 before it is bonded to the active layer 5.

The first substrate 2 is then removed using a selective etchant comprising a 95:5 mixture of 100 V $H_2O_2$ and 35% $NH_4OH$ which attacks GaAs at a faster rate than it attacks GaAlAs (the term "100 V $H_2O_2$" is an abbreviation for 100 Volume $H_2O_2$ and refers to the strength of the peroxide. "Volume" is a standard term for measuring the strength of $H_2O_2$ in solution; thus the strength of x Volume $H_2O_2$ is such that it evolves x times its own volume of $O_2$ on complete decomposition of $H_2O$ and $O_2$).

The GaAlAs buffer layer 1 thus acts as a chemical stop to the etchant used to remove the GaAs substrate 2, so that the etching process stops at the GaAs/GaAlAs interface. The GaAlAs buffer layer 1 is then removed by a different selective etchant comprising a 50% solution of HF in water, which is capable of etching GaAlAs at a much faster rate than it etches GaAs of which the underlying epitaxial layers 4,5 are formed. The HF etching process can thus be made to stop exactly at the interface of the GaAlAs buffer layer 1 and the high conductivity GaAs layer 4.

The above differential etching procedure is used to effect removal of the first GaAs substrate 2 because it is difficult, using conventional GaAs etching techniques, to etch down evenly to the required accuracy (±0.01 μm) over a large area when the total etch depth is of the order of several hundred microns.

Following removal of the first substrate 2 and buffer layer 1, conventional fabrication procedures may be adopted to complete the device fabrication, the only difference being that the usual semi-insulating GaAs substrate of conventional devices is replaced by a glass substrate having good insulating properties.

Thus, parts of the active layer 5 and the high conductivity layer 4 are first etched away to leave a separate isolated mesa for each device on the surface of the second substrate 6. Ohmic source and drain contacts 9,10, fabricated, e.g., of GeAu, are then applied in a conventional manner by first forming a resist mask having holes where the electrode metallizations are to be applied to the surface of the structure, applying a metallization layer over the surface of the resist mask, floating off the metalization layer overlying the resist mask, and then annealing at a temperature of about 450° C. to form an ohmic contact between the contact metallizations 9,10 and the semiconductor mesa. The purpose of the high conductivity semiconductor layer 4 is to improve the quality of the ohmic contact between the source and drain electrodes 9,10 and the active GaAs layer 5 as is known in the art.

It will be seen in FIG. 1(d) that the source and drain contacts 9,10 extend over the edge of the mesa structure onto the $SiO_2$ layer 7 overlying the glass substrate 6 to provide contact pads for external connections to the device.

Following the formation of the source and drain contacts 9,10, a groove or recess 11 is formed in the semiconductor mesa structure in the space between the opposing edges of the source and drain contacts, the groove lying parallel to these two edges and extending to a depth greater than the thickness of the high conductivity layer 4. The groove or recess is formed in conventional manner by applying a resist mask over the surface of the structure having a hole corresponding in shape and position to that of the required groove, and the exposed GaAs removed using a suitable etchant. The etching process is carefully controlled to leave the desired thickness of active GaAs between the floor of the groove 11 and the glass substrate 6. It is this thickness which determines the channel current of the device and will typically be of the order of 0.1 to 0.3 μm. The resist is then removed and the gate electrode 12 of the device then formed.

The gate electrode 12, comprising a narrow strip of conductor fabricated, e.g., of aluminum and extending centrally along the floor of the groove 11 and over the edge of the mesa to terminate in an enlarged contact pad on the surface of the SiO$_2$ layer 7 overlying the substrate 6, is again formed in conventional manner, conveniently using the same resist mask, to provide a Schottky barrier contact with the active GaAs layer between the source and drain electrodes, 9,10.

The glass substrate 6 is then diced up into individual device chips by cleavage along the pre-formed slots 8.

As discussed above, the high conductivity GaAs layer 4 which is provided to improve the quality of the ohmic contact between the source and drain electrodes 9,10 and the active GaAs layer 5 is optional, and may be omitted altogether.

A typical completed device structure is shown in FIG. 2, from which it will be seen that the etched edges of the mesa and the gate electrode recess 11 are inclined at an angle determined by the crystal orientation of the GaAs. This is because the particular etchant used, i.e., 1:1 to 0.05 NaOH and 5 VH$_2$O$_2$ i.e., equal parts by volume of 0.05 NaOH and 5 V H$_2$O$_2$, is orientation sensitive and is thus capable of producing etch grooves which have either a 'V' or 'A' (dovetail) cross-section depending on which face of the GaAs the etchant is applied to.

In the device structure shown, the crystal orientation has been chosen to produce a groove 11 of 'A'-line or dovetail cross-section so that the edge of the mesa over which the gate electrode 12 passes onto the surface of the substrate slopes outwardly, insuring continuity of the gate electrode. This also produces an increased resistance between the gate electrode 12 and the ohmic source and drain contacts 9,10 due to the increased length of active GaAs between them across the floor of the recess 11. Another consequence of this orientation is that edges of the mesa over which the source and drain electrodes 9,10 would normally pass onto the surface of the substrate are undercut. In order to maintain continuity of these electrodes over the mesa edge, castellations 14,14a are provided as shown, enabling the electrodes to pass continuously onto the substrate over outwardly sloping edges of the mesa. Alternatively, the mesa may be made larger, and the source and drain electrodes 9,10 formed wholly on the mesa.

A suitable alternative method of removing the GaAs to form the recess 11 and the mesa, is ion milling. As this process is independent of the crystal orientation the above difficulties do not arise.

To reduce the possibility of deterioration of the active GaAs layer 5 close to its interface with the SiO$_2$ layer 7 in the gate region, i.e., underlying the gate electrode 12, due either to the thermal expansion mismatch between the GaAs and the SiO$_2$ or glass substrate 6, or resulting from the bonding process and the subsequent machining of the glass, an air gap may be provided between these surfaces so that the active GaAs layer is interfaced to air in the gate region. This may be achieved either by recessing the glass substrate in the immediate vicinity of the gate region before bonding it to the active layer, or preferably by suitably recessing the active layer 5 in the gate region as shown in FIG. 3 before bonding it to the glass substrate.

This recess 15 on the free surface of the active GaAs layer 5 is formed by etching using a resist mask, before application of the SiO$_2$ layer 7. Additionally, before the SiO$_2$ layer 7 is applied, alignment holes (not shown) extending through the active GaAs layer 5, and the high conductivity layer 4 where provided, are formed to enable the resist mask, applied over the opposite side of the GaAs active layer to form the mesa during later stages in the fabrication, to be aligned with the recess 15. Thus, following removal of the first substrate 2 and the buffer layer 1, these holes are used to align the mesa etch mask, and the positions of subsequent resist masks used in the formation of the source, gate and drain electrodes can then be aligned with respect to the edges of the recess 15 revealed at the edge of the mesa to ensure registration of the gate electrode with the recess 15.

Figure 4:
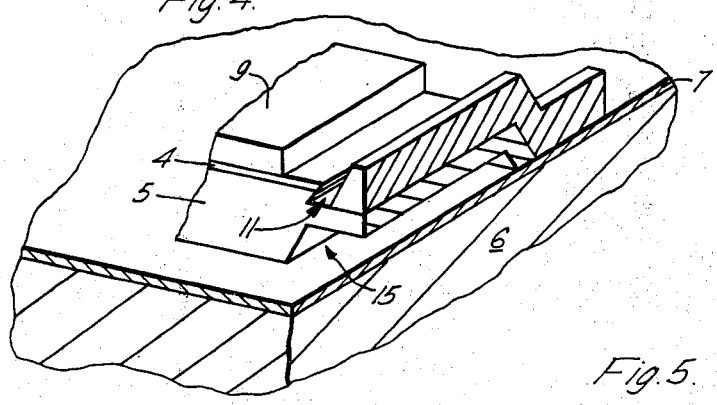
FIG. 4 is a diagrammatic part-sectional perspective view of part of the device shown in FIG. 3.

A disadvantage of this particular process arises from the need to maintain continuity of the gate electrode 12 as it passes over the mesa edge, so that the recess 15 must terminate short of the mesa edge as illustrated in FIG. 4. The distance between the termination of the recess and the edge of the mesa may occupy up to 10% of the total effective gate width (i.e., in its direction of elongation). This results in a shunt path for the device current when the remaining part of the channel is near pinch-off during operation, and hence degrades the mutual conductance characteristics of the device.

This problem may be overcome by a further modification of the above fabrication procedure. This involves forming an additional, non-conducting layer 16 (see FIG. 5) of high resistivity or depleted p-type GaAs or GaAlAs, approximately 0.3 μm thick, on the free surface of the active GaAs layer 5, and forming a recess 18 (similar to the recess 15) extending through this layer 16 to the active GaAs layer 5, prior to the formation of the SiO$_2$. As before alignment holes extending through the layer 16, the active layer 5, and the high conductivity layer 4 where provided, are also formed prior to formation of the SiO$_2$ to enable alignment of the mesa resist mask with the recess 18.

Figure 5:
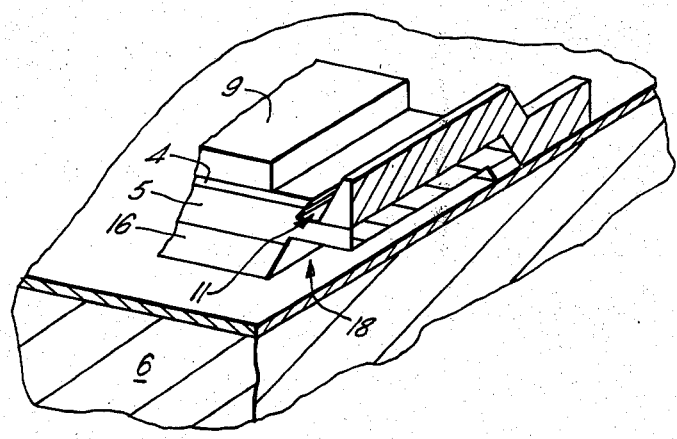
FIG. 5 is a diagrammatic part-sectional perspective view of part of a further modified form of FET in accordance with the invention.

Again the recess 18 must terminate short of the edge of the mesa at one end to maintain continuity of the gate electrode 12 as it passes over the mesa edge onto the substrate 6, but the above mentioned shunt path no longer exists due to the presence of the non-conducting layer 16 as seen in FIG. 5.

The invention thus provides a low-noise microwave FET structure in which the surface of the active layer in the channel region opposite the gate electrode is interfaced either to a good insulator or to air, so insuring that the charge carriers are confined to the active GaAs layer 5 during operation, particularly, near pinch-off.

However, many other modifications may be made to the above fabrication procedures without departing from the scope of the invention.

For example the glass substrate 6 may be applied to the structure comprising the first substrate 2 and active layer 5 using instead of $SiO_2$, a low melting point glass such a borosilicate glass applied for example by sputtering or evaporation.

Alternatively, the second substrate, which may be of any suitable insulating material, may be applied using an adhesive, for example a polyimide resin. One particularly suitable polyimide resin is that sold under the name of KERIMID (Registered Trade Mark) 601 as discussed earlier used with an alumina second substrate. An advantage of using such adhesive bonding techniques is that it can be carried out at low temperatures, thus reducing the possibility of degrading the active layer.

A further method of applying the insulating substrate using an adhesive, but which enables the requirements for the adhesive to be considerably relaxed, involves applying a thin coating of insulating material of the order of 10 to 50 μm thick to the appropriate surface of the structure comprising the first substrate and active layer, and then applying the second substrate to this insulating coating using an adhesive. The insulating coating may comprise, for example, $SiO_2$, $Si_3N_4$, alumina, glass, polycrystalline GaAs or a plastics resin, such as polyimide resin applied using any suitable known technique which does not cause degradation of the active layer. Because the adhesive used need not have such good microwave properties or be such a good expansion match to the active layer and first substrate being relatively remote therefrom, a much wider range of adhesives may be used.

Figure 6A:
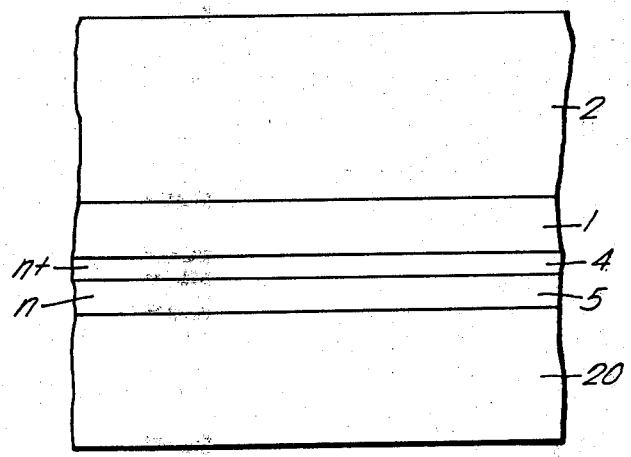
FIGS. 6(a) and 6(b) show schematic sectional views illustrating various stages in a modified method of fabricating a FET in accordance with the invention.
Figure 6B:
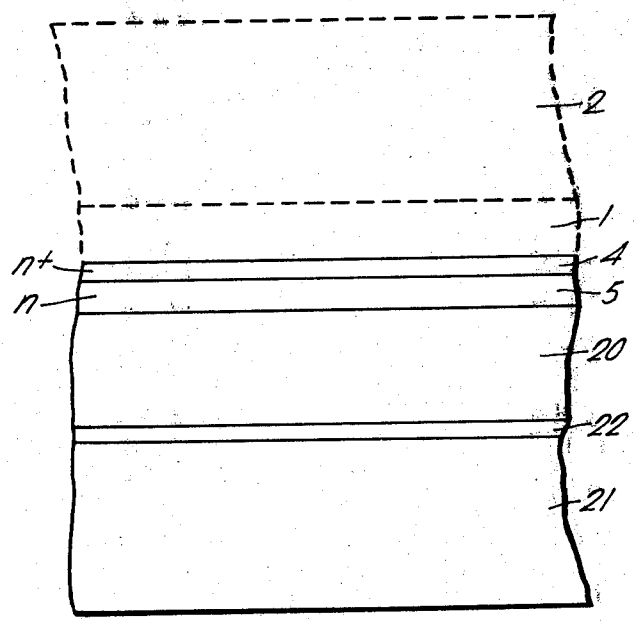

Various stages in the application of the second substrate by this method prior to removal of the first substrate are illustrated in FIGS. 6(a) and 6(b). Following formation of the GaAlAs buffer layer 1, the high conductivity (n+) GaAs layer 4 and the active layer 5 on one surface of the semi-insulating GaAs first substrate 2, a coating 20 of a suitable insulating material which for the purposes of the present example comprises a condensation-type polyimide resin such as KERIMID (Registered Trade Mark) 601, is applied to the free surface of the active layer 5 in liquid form (i.e., in solution). The entire coated structure is then spun at high speed to produce a uniformly thick coating of the polyimide resin of the desired thickness, typically several tens of microns thick, although this is not critical. The structure is then heated to about 120° C. for 30 minutes to dry the solvent before curing the resin at a temperature of 220° C. again for approximately 30 minutes. The result is a substantially bubble-free coating 20 having good mechanical and low-loss microwave properties, thermally and chemically compatible with the GaAs active layer 5. Alternatively, the coating 20 may be built up from a plurality of successively formed thinner (sub-micron) layers of the coating material.

The second substrate 21, comprising a plate of glass or any other suitable insulating material, is applied to the polyimide coating 20 using a suitable adhesive 22. The adhesive used must of course be capable of withstanding the annealing temperature (450° C.) used in forming the source and drain contacts 10,11 as well as being chemically resistant to the etchants and solvents used in the later fabrication stages. However, because the low-loss coating 20 provides a mechanical barrier between the active layer and this adhesive, the requirements of the adhesive in terms of its chemical and thermal compatibility with the active layer, and its microwave properties can be considerably relaxed.

As mentioned above, the coating may alternatively comprise $SiO_2$, $Si_3N_4$, alumina, glass, or polycrystalline GaAs applied as appropriate by evaporation, ion sputtering deposition or any other process capable of producing a high quality coating having good low-loss microwave properties. The substrate may then be applied to this coating as described above, using an adhesive, or it may be formed in situ by any suitable technique such as by moulding at elevated temperature and pressure. A second substrate of plastic material, e.g., polyimide resin, may be formed in situ by applying it to the structure in powdered form, and then curing it at elevated temperature and pressure. A second substrate of glass, e.g., borosilicate glass, may be applied by evaporation or sputtering, or as a glass frit, but this latter technique involves a relatively high temperate fusion process.

The second substrate may also be applied directly to the structure comprising the first substrate and active layer using a suitable adhesive, e.g., polyimide resin, but the above initial coating process is preferred as this enables the material interfaced to the active layer to be inspected for quality.

Where the second substrate is applied other than by the high temperature bonding process using $SiO_2$ or low melting point glass as described with reference to FIG. 1 the mesa may be defined before application of the second substrate. This may be achieved either by complete removal of the part of the active and high conductivity GaAs layers 5,4 surrounding the mesa, so that the mesa is completely isolated before application of the second substrate, or by removing only part of the total thickness of the GaAs layers 4,5 (or layer 5 where no high conductivity layer 4 is provided) before application of the second substrate, and then free etching the surface of the GaAs exposed by removal of the first substrate 2 and buffer layer, to complete removal of the reduced thickness of GaAs and thereby completely isolate the mesa.

The mesa thus formed will be embedded in the insulating material used in applying the second substrate, and its top surface will be flush with, or be slightly recessed with respect to the surface of the insulating material. The source, drain and gate electrodes may thus be formed using the same procedures as before, the top surface of the mesa being recessed before formation of the gate electrode therein, without the above difficulties associated with draping the electrodes over the mesa edge.

The various modifications to the fabrication procedures and device configuration described with reference to FIGS. 2 to 5 may also similarly be used where this method of applying the second substrate is employed, although the need for doing so may not arise because the temperature involved, and thus the likelihood of degrading the active layer, are considerably lower.

The first semiconductor substrate on which the active layer is formed, may be removed using any suitable technique capable of effecting the removal without substantially affecting the quality or uniformity of thickness of the active layer. To remove any lattice defects or impurities which may occur in the active layer due to its interface with the relatively impure substrate on which it is formed, in particular where no intermediate high conductivity layer is provided, the active layer may initially be formed thicker than required, and a thin surface layer then removed following removal of the first substrate. Alternatively or additionally, a buffer layer of high quality semiconductor material may be formed on the surface of the first substrate prior to the formation of the active layer, this buffer layer then being removed following removal of the first substrate. Where differential etching is used to remove the first substrate, as described for example in the above embodiment, this buffer layer (GaAlAs where the substrate and active layer are GaAs) also acts as a chemical stop to the differential etchant used to remove the first substrate. In such a case, removal of a thin surface layer of the active layer at its interface with the buffer layer, after the buffer layer has been removed, may be desirable to effect removal of any lattice defects or impurities due to its interface with the buffer layer.

An alternative preferential etching technique which may be used to remove the first substrate is described in "Preferential Etch Scheme for GaAs-GaAlAs", C. B. Burstell, R. Y. Hung and P. G. McMullin, IBM Technical Disclosures Bulletin, Vol. 20, No. 6, p. 2451, November 1977.

As discussed above, following removal of the first substrate and buffer layer where the latter is provided, the subsequently formed device structure may be of any known configuration. For example, two source-drain gaps may be provided between a pair of source electrodes and a single central drain electrode, or vice versa, with a pair of gate electrodes extending from a common connection pad into the said gaps resulting in a reduced gate resistance for a given total gate width (i.e., width in the direction of elongation along the source-drain gap).

A power FET device comprising a plurality of such FETs connected in parallel, i.e., with their respective source, drain and gate electrodes connected together, may be formed on a common substrate.

Although it is preferred to fabricate devices in accordance with the present invention using GaAs as the semiconductor material, the invention is not necessarily restricted to the use of this particular material.

What is claimed is:

1. A method of fabricating a field effect transistor comprising the steps of forming a high quality buffer layer of semiconductor material on the surface of a first substrate of semiconductor material, thereafter forming an active layer of semiconductor material over said buffer layer and over said surface of said first substrate, applying a second substrate of insulating material to the surface of the structure comprising the first substrate, buffer layer, and active layer so that the active layer lies between the two substrates, removing the first substrate and buffer layer, and forming source, drain and gate electrodes over the surface of the active layer opposite the second substrate.

2. A field effect transistor fabricated by the method of claim 1.

3. A method as claimed in claim 1, wherein the buffer layer is removed by etching using a selective etchant which attacks the buffer layer at a faster rate than it attacks the active layer.

4. A method as claimed in claim 3, wherein the first substrate is removed by etching using a selective etchant which attacks the first substrate at a faster rate than it attacks the buffer layer.

5. A method as claimed in claim 1, wherein the first substrate is GaAs, the buffer layer is GaAlAs and the active layer is n-type GaAs.

6. A method as claimed in claim 5, wherein the buffer layer is removed by etching with HF.

7. A method as claimed in claim 1, wherein, following removal of the first substrate and buffer layer, a surface thickness of the active layer, at least in the region on which the gate electrode is to be formed, is removed prior to formation of the gate electrode.

8. A method as claimed in claim 1, wherein prior to applying the second substrate to the structure comprising the first substrate, buffer layer, and active layer, a recess is formed in the active layer, and following removal of the first substrate and buffer layer, the gate electrode is formed on the surface of the active layer immediately opposite the recess.

9. A method as claimed in claim 1, wherein prior to applying the second substrate to the structure comprising the first substrate, buffer layer, and active layer, a non-conducting semiconductor layer is formed over the free surface of the active layer and a region of said non-conducting layer is then removed to define a recess through which a region of the underlying active layer is exposed, and following removal of the first substrate and buffer layer, the gate electrode is formed on the surface of the active layer immediately opposite said recess.

10. A method as claimed in claim 8 or claim 9, wherein, prior to formation of the source, drain and gate electrodes, part of the active layer is removed to define an isolated mesa of said active layer overlying the second substrate, and the source, drain and gate electrodes are then formed over the mesa.

11. A method as claimed in claim 10, wherein each electrode also has a portion which extends continuously over the edge of the mesa to provide a contact pad for external connection to the device.

12. A method as claimed in claim 11, wherein the recess underlying the gate electrode terminates at one end short of the edge of the mesa to provide a surface over which the said portion of the gate electrode extends continuously over the mesa edge.

13. A method as claimed in claim 1 wherein said layers are formed epitaxially.

14. A method as claimed in claim 1, wherein the second substrate is glass applied to the structure comprising the first substrate and the active layer by first applying a coating of $SiO_2$ to the surface of the said structure, and then fusing the second substrate to the $SiO_2$ coating.

15. A method as claimed in claim 1, wherein the second substrate is applied to the structure comprising the first substrate, buffer layer, and active layer by means of an insulating adhesive comprising cured polyimide resin.

16. A method as claimed in claim 1, wherein the second substrate is applied to the structure comprising the first substrate, buffer layer, and the active layer by first applying a coating of insulating material and then applying the second substrate to the said coating of insulating material.

17. A method as claimed in claim 16, wherein said coating of insulating material comprises cured polyimide resin, and the second substrate is applied to it by means of an adhesive.

18. A method as claimed in claim 1, wherein said second substrate is formed in situ.

19. A method as claimed in claim 16, wherein said second substrate is formed by moulding.

20. A method as claimed in claim 19, wherein the second substrate comprises polyimide resin cured under pressure before removal of the first substrate.

* * * * *